United States Patent [19]

Dalamangas et al.

[11] 4,202,588
[45] May 13, 1980

[54] ELECTRICAL CONNECTOR AND SUPPORT MEANS THEREFOR

[75] Inventors: Chris A. Dalamangas, Union; Thomas P. Piccirillo, North Plainfield; Donald P. Seip, Bridgewater, all of N.J.

[73] Assignee: Technical Wire Products, Cranford, N.J.

[21] Appl. No.: 964,638

[22] Filed: Nov. 29, 1978

[51] Int. Cl.² .............................................. H01R 13/48
[52] U.S. Cl. ............................. 339/59 M; 339/125 R; 339/DIG. 3
[58] Field of Search ............ 339/17 LM, 17 M, 59 M, 339/61 M, 125 R, DIG. 3

[56] References Cited

U.S. PATENT DOCUMENTS

| | | | |
|---|---|---|---|
| 3,509,296 | 4/1970 | Harshman et al. | 339/DIG. 3 |
| 4,027,936 | 6/1977 | Nemoto et al. | 339/59 M |
| 4,057,311 | 11/1977 | Evans | 339/61 M |
| 4,118,092 | 10/1978 | Sado et al. | 339/59 M |

Primary Examiner—Joseph H. McGlynn
Attorney, Agent, or Firm—Quaintance, Murphy & Richardson

[57] ABSTRACT

An electrical connector is disclosed which employs a layered elastomeric strip consisting essentially of a plurality of mutually parallel alternating layers of conductive and non-conductive elastomer. The layered elastomeric strip is dimensioned in such a manner as to be non-self-supporting thus requiring a support means. The support means is disclosed consisting generally of a flexible supporting strip fixed to the layered elastomeric strip and a substantially rigid support member to which the flexible support member is slidably interlocked. The rigid support member is disclosed to possibly further include one or two adhesive layers with overlying release strips for adhesively bonding the rigid support to a substrate of a component thought to be electrically connected.

12 Claims, 5 Drawing Figures

ELECTRICAL CONNECTOR AND SUPPORT MEANS THEREFOR

BACKGROUND OF THE INVENTION

1. Field of the Invention

This invention pertains generally to electrical connectors employing layered elastomeric strips consisting essentially of a plurality of mutually parallel layers of alternately conductive and non-conductive elastomer and sold by the assignee of this application under the trademark ZEBRA. The invention particularly pertains to retainers and supports for layered elastomeric electrical connectors of this general class.

2. Description of the Prior Art

In recent years, particularly with the substantial reduction in physical dimensions of electronic components such as LED and LCD alpha-numeric displays, integrated circuits, and the like, the use of electrical connectors employing stamped metal contacts has begun to give away to a class of electrical connectors employing electrically conductive elements which are not wholly metallic. A particularly useful layered elastomeric connector was disclosed in Ser. No. 468,651 filed May 10, 1974, now abandoned, which consisted essentially of a plurality of mutually parallel layers of alternately conductive and nonconductive elastomer. Similar layered connectors are to be found in published Japanese Patent Applications Sho 49-765 and Sho 47-25523. A connector of this general class has been sold under the trademark ZEBRA by the assignee of the present application. The generic term layered elastomeric connector has been adopted to refer to this general class of electrical connectors.

When the layered elastomeric connector was first introduced, problems directly associated wth contact potentials developing between the connector itself and the electrically conductive areas sought to be connected arose. It was first generally assumed that to overcome such problems, one merely increased the contacting area of the elastomeric connector, thereby affording a greater probability of eliminating this undesirable contact potential. This solution yielded yet additional problems principally related to surface smoothness and linearity of the connector as well as to durometer of the elastomers employed since an increase in contact area results in a corresponding increase in the total force required to connect electrical components thereto. In situations such as that illustrated in U.S. Pat. No. 3,885,173, it had been the general practice to form a self-supporting layered elastomeric connector in the form of a strip or ribbon which connects a number of mating electrically conductive areas. In order that the strip or ribbon be self-supporting, the width of the elastomeric strip or ribbon was usually equal to or greater than the dimension of separation between the two sets of electrically conductive areas sought to be connected. Since the total force which could be applied to many electrical components is rather restricted due to the materials used in their construction, the contact pressures between the elastomeric connector and the electrically conductive areas sought to be connected was rather low, and as a result, satisfactory performance was not always achieved.

It was subsequently discovered that an increase in performance reliability of layered elastomeric connectors could be achieved by simply reducing the contact area thereby increasing the contact pressure between the elastomeric electrical connector and the electrically conductive areas sought to be connected. A reduction in contact area could only be achieved by a substantial reduction in width of the connector strip or ribbon while maintaining the same separation between the two sets of electrically conductive areas sought to be connected. The ratio of separation distance to strip width has been adopted to define a dimensionless number referred to by the term aspect ratio. While layered elastomeric connectors were originally introduced having an aspect ratio in the neighborhood of 1 or even less than 1, it has now been learned that aspect ratios greater than 2 and preferably about 3 or 4 are preferred. While increased performance reliability for such a layered elastomeric connector is achieved, the layered elastomeric electrical connector is no longer self-supporting and some means for supporting the connector is necessary. One such support means is to be found in U.S. Pat. No. 3,998,512 which discloses simply a relatively rigid plastic support strip which supports an elastomeric connector having a very small width dimension. The support strip permitting the necessary compression of the elastomeric connector only through a very minor portion of the connector. Other examples of the prior art are to be found in U.S. Pats. No. 3,895,413, 3,998,513, 4,012,117, and Application Ser. No. 846,344 filed Oct. 28, 1978 entitled Retainer for the Elastomeric Electrical Connector.

A common failing of the prior art supports for layered elastomeric connectors is the reliance entirely on the elastomeric character of the layered elastomeric connector to compensate for variations in surface smoothness and linearity of the surfaces sought to be connected. While reliance was often placed on softer durometer elastomers, this has not always proved to be a satisfactory solution. It is therefore an object of the present invention to provide support means which incorporates features which respondto inherent variations in surface smoothness and linearity which might otherwise exceed the elastic deformation ability of the layered elastomeric connector.

SUMMARY OF THE INVENTION

An electrical connector constructed according to the present invention employs a layered elastomeric electrical connector consisting essentially of a plurality of mutually parallel layers of alternately conductive and non-conductive elastomer. The layered elastomeric connector is supported in operable position between two surfaces having electrically conductive areas thereon which are sought to be connected, the layers of the layered elastomeric connector being arranged generally perpendicularly to the surfaces sought to be connected. The support means of the present invention comprises a first member of an elastomer having a flexibility approximating that of the layered elastomeric connector, the first member having a first side fixed to one side of the layered elastomeric connector and a second side opposite the first side comprising a plurality of engaging elements arranged generally parallel to the layers of the layered elastomeric connector. The support means further comprises a second member more rigid than the first member, the second member being slidably interlocked with the plurality of engaging elements of the first member. The engaging elements of the first member can comprise a plurality of parallel slots slidably engaging a like plurality of protuberances on the second member or conversely the engaging elements can be a plurality of protuberances on the first member engaging a like plurality of slots on the second member. The sliding engagement between the first and second support members permits a mechanical correction for any fault or defect in surface smoothness or linearity which might not be able to be compensated for merely by the elastic deformation of the layered elastomeric connector. The support means of the present invention thus may be viewed as a dynamic support structure rather than simply a static support structure as was typical of the prior art.

Since some relative movement between the first and second support members is anticipated, the transverse dimension of the layered elastomeric connector is greater than the transverse dimension of the second more rigid support member. Transverse dimension is here defined to be that dimension in the direction of the separation distance between the two areas sought to be connected by the layered elastomeric connector. In general, the first supporting member will be co-extensive with the layered elastomeric connector while the second support member will be somewhat thinner so as to permit some relative movement between the first and second supporting members.

The second more rigid supporting member will generally comprise a flange or plate extending a substantial distance as compared to the width of the layered elastomeric connector so as to give stability to the overall combined structure. The second member can further comprise an adhesive coating on one or more surfaces and optionally one or more release sheets overlaying the adhesive coating to permit bonding of this second support member to one or more surfaces of components or substrates sought to be connected with this connector.

The first more flexible support member is preferably formed of an elastomer of substantially the same character forming the layered elastomeric connector and thus have compressibilities or durometer between 35 and 70 Shore-A, 45 durometer being generally preferred. The second more rigid member is typically formed of an injection molded phenolic resin or the like. Other features and related advantages of the several aspects of this invention will become apparent to those of ordinary skill in the art from the following discussion of some of the preferred embodiments together with the accompanying figures and appended claims.

DESCRIPTION OF PREFERRED EMBODIMENTS

Figure 1:
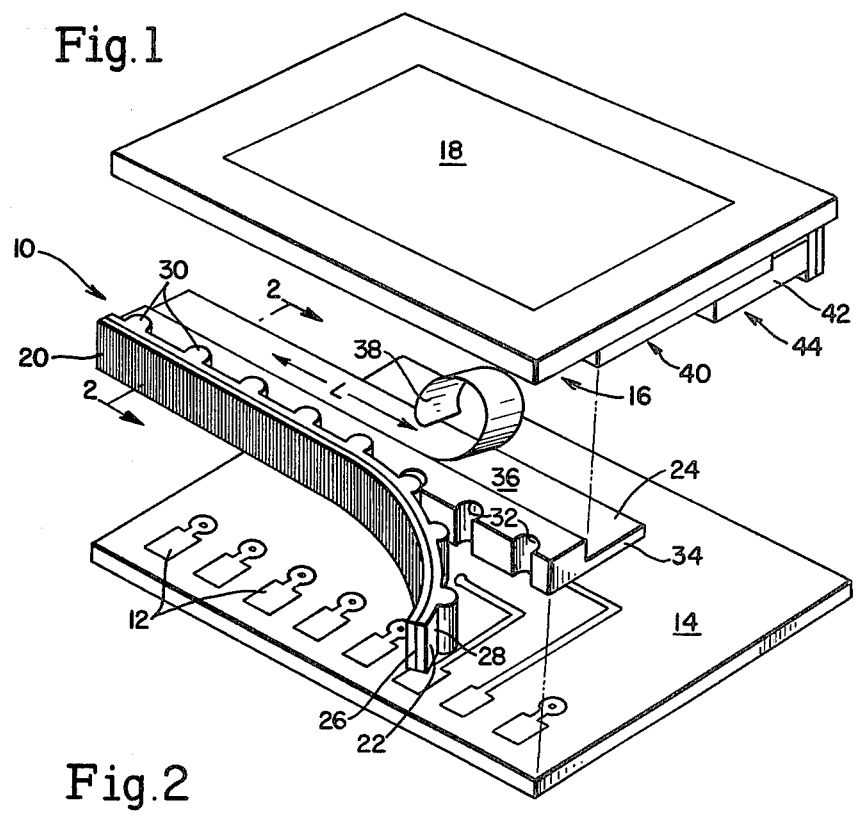
FIG. 1 is an exploded view of a connector and supporting means employed to connect a liquid crystal display to a printed circuit.

A connector 10 according to the present invention is illustrated in FIG. 1 as it is about to be employed to connect the conductive areas 12 on circuit board 14 with corresponding conductive areas, not illustrated on the under side 16 of display 18. The connector employs a layered elastomeric strip 20 which consists essentially of a plurality of mutually parallel layers of alternately conductive and non-conductive elastomer, the layers being arranged generally perpendicular to the surfaces containing the conductive areas 12, 16. To support the layered elastomeric strip 20 in operable position between the electrically conductive areas of the two surfaces, a support means is provided which comprises a first member 22 and a second member 24.

The first member 22 of the support means is formed of an elastomer having a flexibility comparable to that of the layered elastomeric connector 20 while the second member 24 is substantially more rigid than member 22. A first side 26 of member 22 is bonded to the layered elastomeric connector 20 while the second side 28 opposite the first side 26 comprises a plurality of ridges 30 which are arranged generally parallel to the mutually parallel layers of the layered elastomeric connector 20. The second member 24 includes a plurality of longitudinal slots 32 which receive the ridges 30 in sliding engagement. The second member 24 also includes a flange or tab 34 for giving stability and rigidity to the overall connector structure. A top surface 36 of flange 34 can be advantageously coated with an adhesive and peelable release strip 38 for bonding the second member of the support means to a substrate such as lower surface 40 of display 18. Another connector and support means 42 according to the present invention is illustrated in its bonded position to the lower surface 40 of display 18. A second release strip, not illustrated, could be provided on the lower surface 44 so as to bond the now combined structure 18 and 42 to circuit board 14. It is generally thought that physical hardware in the nature or clips or the like might be found to be superior for this function although high-strength adhesives might prove to be satisfactory.

Figure 2:
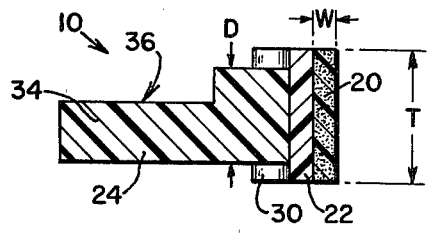
FIG. 2 is a cross-section of the connector and support means illustrated in FIG. 1 taken along line 2—2.

FIG. 2 is a sectional detail of the connector and support means 10 illustrated in FIG. 1 taken along section line 2—2 and corresponding portions of the apparatus are identified by corresponding numerals. It is to be noted that the layered elastomeric connector 20 has an aspect ratio, T/W of more than 2, the preferred aspect ratio being 3 or greater. The thickness D of the more rigid support member 24 in the vicinity of the engaging elements 30, 32 should be less than the thickness T of the layered elastomeric connector so as to provide for some compression upon mating with the surfaces to be electrically connected as well as provide for some physical variation in location due to imperfections in surface smoothness and linearity of the surfaces being connected. The engaging elements 30 and 32 slidably secure the first support member 22 to the second support member 24 but still provide for vertical motion parallel to the individual layers making up the layered elastomeric connector 20. This is most clearly illustrated in FIG. 5 which is a rear view, that is a view from the left of FIG. 2, of the connector where again corresponding portions of the connector and support means have been given corresponding reference numerals. It is to be noted that while the more rigid support means 24 retains a substantially planar configuration, the flexible support means 22 and thus the layered elastomeric connector 20 bonded thereto is free to vertically undulate so as to compensate for errors in surface smoothness or the like occurring in the surfaces to be connected. This mechanical sliding of support member 22 with respect to support member 24 permits a mechanical correction which might not otherwise be possible if one were forced to rely on simply the elastic deformation capabilities of the layered elastomeric connector alone. It is to be understood that the direction of this vertical sliding variation V is generally parallel to the layers of the layered elastomeric connector 20.

Figure 3:
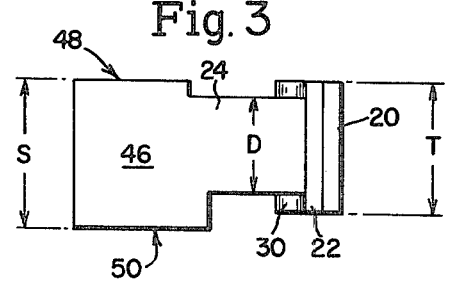
FIG. 3 is an end view of yet another embodiment of a connector and support means according to the present invention.
Figure 5:
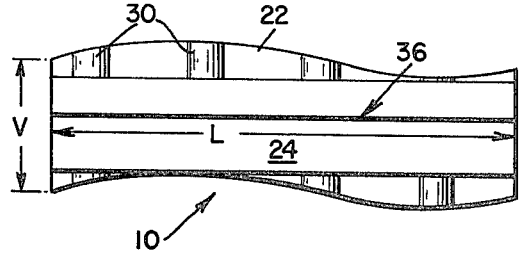
FIG. 5 is an elevation view of FIG. 2 as viewed from the left showing the variation in height which might occur due to variations in surface smoothness and linearity of the surfaces sought to be connected.

FIG. 3 illustrates another embodiment of a connector according to the present invention wherein the layered elastomeric connector 20 and flexible support member 22 are bonded together and attached to the fixed support member 24 in a manner similar to that illustrated in FIGS. 1, 2 and 5. Again, it is to be noted that the dimension D of the rigid support member 46 is less than dimension T, the thickness of the layered elastomeric connector in the immediate vicinity of the engaging elements 30, 32. The surfaces 48 and 50 can be variously situated so as to achieve an overall thickness S of any desired dimension having no necessary relation with thickness T of the layered elastomeric connector.

Figure 4:
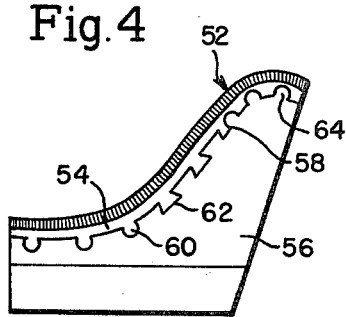
FIG. 4 is a plan view of yet another connector and support means according to the present invention illustrating the various engagement means which might be employed to connect the two-part support structure.

FIG. 4 is intended to illustrate some of the many variations which might reasonably be employed with a connector and support means according to the present invention. A layered elastomeric connector 52 is bonded to a first flexible support member 54 as previously discussed. A more rigid support member 56 is provided, the mating surface between support members 54 and 56 having engaging elements 58. As illustrated, the engaging elements may be of any convenient shape such as arcs 60 or dovetail 62 and may be considered as extending either from the flexible member 54 into the more rigid member 56 or as extending from the more rigid member 56 into the more flexible member 54 particularly as illustrated with mating elements 64. Further, while the connector illustrated in FIG. 1 is generally linear in the dimension L, it will be noted from FIG. 4 that curvilinear patterns could be employed should the situation demand such a connector. While the invention has here been described in considerable detail with reference to certain preferred embodiments, it will be understood that other variations and modifications can be effected within the spirit and scope of the invention as described above and as defined in the instant claims.

We claim:

1. A support means for supporting a layered elastomeric electrical connector in operable position between two surfaces having electrically conducted areas thereon, the layered elastomeric electrical connector consisting essentially of a plurality of mutually parallel layers of alternately conductive and non-conductive elastomers, the layers arranged generally perpendicularly to said surfaces, the support means comprising:
    (a) the first member of flexible elastomer having a first side fixed to one side of said layered elastomeric connector and a second side opposite the first side comprising a plurality of engaging elements, and
    (b) a second member more rigid than the first member, the second member slidably interlocked with the plurality of engaging elements of the first member.

2. The support means of claim 1 wherein said plurality of engaging elements of the first member are arranged substantially parallel to said mutually parallel layers of the layered elastomeric electrical connector.

3. The support means of claim 1 wherein said second member comprises a plurality of parallel slots, slidably engaging said plurality of engaging elements of the first member.

4. The support means of claim 1 wherein said second member comprises a plurality of parallel ridges, slidably engaging said plurality of engaging elements of the first member.

5. The support means of claim 1 wherein the longitudinal extent, measured substantially parallel to said two surfaces to be connected, of the first and second members is substantially coextensive.

6. The support means of claim 1 wherein the transverse dimension of the first member parallel to said engaging elements is greater than the transversed dimension of the second member interlocking therewith.

7. The support means of claim 1 wherein the second member further comprises an adhesive coating on a top surface perpendicular to said first and second sides of the first member, and a first releasable sheet overlaying the adhesive coating.

8. The support means of claim 7 wherein the second member further comprises a second adhesive coating on a bottom surface opposite said top surface, and a second releasable sheet overlaying the second adhesive coating.

9. A support means for supporting a layered elastomeric electrical connector in operable position between two surfaces having electrically conductive areas thereon, the layered elastomeric electrical connector consisting essentially of a plurality of mutually parallel layers of alternately conductive and non-conductive elastomers, the layers arranged generally perpendicular to said surfaces, the support means comprising:
    (a) a first member of elastomer having a flexibility comparable to that of the layered elastomeric electrical connector, having a first side fixed to one side of layered elastomeric connector, and a second side opposite the first side comprising a plurality of ridges arranged generally parallel to said mutually parallel layers of the layered elastomeric connector, and
    (b) a second member, more rigid than the first member, the second member comprising a plurality of parallel slots slidably engaging said plurality of ridges of the first member, an adhesive coating on a portion of a top surface perpendicular to said plurality of slots, and a first releasable sheet overlaying the adhesive coating, the dimension of the first member parallel to said plurality of ridges being greater than the dimension in the same direction as the plurality of slots of the second member interlocking therewith.

10. The support means of claim 9 wherein the second member further comprises a second adhesive coating on a bottom surface opposite said top surface, and a second releasable sheet overlaying the second adhesive coating.

11. An electrical connector for connecting a plurality of electrically conductive areas, a portion of said plurality of areas occurring on each of two spaced apart surfaces, the connector comprising:
    (a) a layered elastomeric strip consisting essentially of a plurality of mutually parallel layers of alternately conductive and non-conductive elastomer, the layers arranged generally perpendicular to said surfaces, (b) a first support member having a flexibility comparable to said layered elastomeric strip, having a first side fixed to one side of the layered elastomeric strip, and having a side opposite the first side comprising a plurality of linear engaging elements arranged generally parallel to the layers of the layered elastomeric stip, and (c) a second support member substantially more rigid than said first support member, the second support member also comprising a pair of surfaces generally perpendicular to said plurality of engaging elements of the first support member for contacting said two surfaces having electrically conductive areas thereon.

12. An electrical connector for connecting a plurality of electrically conductive areas positioned on a first surface with another plurality of electrically conductive areas positioned on a second surface arranged generally parallel to the first surface, the electrical connector comprising:

(a) a substantially rigid support member situated between said two surfaces having a side generally perpendicular to said two surfaces, the side including a plurality of linear engaging elements, (b) a second support member more flexible than said substantially rigid support member having a first side slidably interlocked to said plurality of engaging elements and having a second side opposite said first side, and (c) a layered elastomeric electrical connector bonded to said second side of the second support member, the layered elastomeric electrical connector consisting essentially of a pluraliity of mutually parallel alternating layers of conductive and non-conductive elastomers the layers arranged generally perpendicular to and in mating relationship with the electrically conductive areas of the two surfaces sought to be connected.

* * * * *